US009728528B2

(12) United States Patent
Moroz et al.

(10) Patent No.: US 9,728,528 B2
(45) Date of Patent: Aug. 8, 2017

(54) METHOD AND APPARATUS FOR FLOATING OR APPLYING VOLTAGE TO A WELL OF AN INTEGRATED CIRCUIT

(71) Applicant: SYNOPSYS, INC., Mountain View, CA (US)

(72) Inventors: Victor Moroz, Saratoga, CA (US); Jamil Kawa, Campbell, CA (US); James D. Sproch, Monte Sereno, CA (US); Robert B. Lefferts, Portland, OR (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/564,586

(22) Filed: Dec. 9, 2014

(65) Prior Publication Data
US 2015/0162320 A1 Jun. 11, 2015

Related U.S. Application Data

(63) Continuation of application No. 13/374,335, filed on Dec. 22, 2011, now Pat. No. 9,287,253.
(Continued)

(51) Int. Cl.
*H01L 27/02* (2006.01)
*H01L 21/8238* (2006.01)
*H01L 27/092* (2006.01)

(52) U.S. Cl.
CPC .. *H01L 27/0207* (2013.01); *H01L 21/823871* (2013.01); *H01L 21/823878* (2013.01); *H01L 21/823892* (2013.01); *H01L 27/0928* (2013.01)

(58) Field of Classification Search
CPC ......... H01L 21/823871; H01L 27/0928; H01L 21/823878; H01L 21/82392
See application file for complete search history.

(56) References Cited

U.S. PATENT DOCUMENTS 3,806,741 A 4/1974 Smith
4,433,253 A 2/1984 Zapisek
(Continued)

FOREIGN PATENT DOCUMENTS

CN 1581354 A 2/2005
CN 1742209 A 3/2006
(Continued)

OTHER PUBLICATIONS

Bryant et al., "Low-Power CMOS at Vdd=4kT/q", Device Research Conference 2001, IEEE Jun. 25, 2001, pp. 22-23.
(Continued)

*Primary Examiner* — Jung Kim
(74) *Attorney, Agent, or Firm* — Haynes Beffel Wolfeld LLP

(57) ABSTRACT

In one well bias arrangement, no well bias voltage is applied to the n-well, and no well bias voltage is applied to the p-well. Because no external well bias voltage is applied, the n-well and the p-well are floating, even during operation of the devices in the n-well and the p-well. In another well bias arrangement, the lowest available voltage is not applied to the p-well, such as a ground voltage, or the voltage applied to the n+-doped source region of the n-type transistor in the p-well. This occurs even during operation of the n-type transistor in the p-well. In yet another well bias arrangement, the highest available voltage is not applied to the n-well, such as a supply voltage, or the voltage applied to the
(Continued)

p+-doped source region of the p-type transistor in the n-well. This occurs even during operation of the p-type transistor in the n-well.

22 Claims, 14 Drawing Sheets

Related U.S. Application Data

(60) Provisional application No. 61/555,864, filed on Nov. 4, 2011.

(56) References Cited

U.S. PATENT DOCUMENTS

| | | | |
|---|---|---|---|
| 6,037,808 | A | 3/2000 | Houston et al. |
| 6,218,895 | B1 | 4/2001 | De et al. |
| 6,498,371 | B1 | 12/2002 | Krishnan et al. |
| 6,635,518 | B2 | 10/2003 | Aipperspach et al. |
| 6,674,127 | B2 | 1/2004 | Kotani |
| 6,777,978 | B2 | 8/2004 | Hart et al. |
| 7,400,162 | B2 | 7/2008 | Gattiker et al. |
| 7,586,155 | B2 | 9/2009 | Kapoor |
| 8,217,435 | B2 * | 7/2012 | Chang .............. H01L 27/108 257/288 |
| 8,273,617 | B2 * | 9/2012 | Thompson ...... H01L 21/823412 257/E21.006 |
| 2001/0028089 | A1 | 10/2001 | Adan |
| 2003/0080782 | A1 | 5/2003 | Bailey et al. |
| 2004/0014268 | A1 | 1/2004 | Ishibashi et al. |
| 2007/0008007 | A1 | 1/2007 | Yasui |
| 2007/0080406 | A1 | 4/2007 | Snyder et al. |
| 2007/0109034 | A1 | 5/2007 | Itoh et al. |
| 2007/0247213 | A1 | 10/2007 | Kapoor |
| 2008/0067588 | A1 | 3/2008 | Williams et al. |
| 2010/0090282 | A1 | 4/2010 | Ozawa et al. |
| 2011/0079923 | A1 | 4/2011 | Suh |
| 2012/0112246 | A1 | 5/2012 | Ning et al. |

FOREIGN PATENT DOCUMENTS

| | | |
|---|---|---|
| CN | 101326640 A | 12/2008 |
| CN | 102054838 A | 5/2011 |
| TW | 201034165 A | 9/2010 |

OTHER PUBLICATIONS

Jayapal et al., "Minimizing Energy Consumption with Variable Forward Body Bias for Ultra-Low Energy LSIs," VLSI Design, Automation and Test, 2007, VLSI International Symposium Apr. 2007, pp. 1-4.
European Search Report dated May 15, 2015 for EP Patent Application No. 12845264.6, 10 pages.
Taiwan Office Action dated Dec. 27, 2014 for Application No. 101140149 consisting of 13 pages.
Stanley Wolf, "Silicon Processing for the VLSI Era vol. 4: Deep-Submicron Process Technology," pp. 501-505, Lattice Press, Sunset Beach, CA 2002.
L. Glasser et al., The Design and Analysis of VLSI Circuits, Addison-Wesley Publishing Company, Inc., 1985, Reading, MA.
C. Mead et al., "Introduction to VLSI Systems," Addison-Wesley Publishing Company, Inc., 1980, Reading, MA.
N.H.E. Weste et al., "Principles of CMOS VLSI Design," Addison-Wesley Publishing Company, Inc., 1993, Reading, MA.
International Search Report dated Mar. 29, 2013 for PCT/US12/62607, 10 pp.
Stanley Wolf, "Silicon Processing for the VLSI Era vol. 4: Deep-Submicron Process Technology," Chapter II, pp. 501-572, Lattice Press, Sunset Beach, California, 2002.
Vitezslav Benda, et al., "Power Semiconductor Devices, Theory and Applications," Chapter 2, pp. 33-67, John Wiley & Sons, West Sussex, England, 1999.
TW 101140149—Office Action dated Dec. 27, 2014, 9 pages.
U.S. Appl. No. 13/374,335—Office Action dated Jun. 1, 2015, 9 pages.
EP 12845264.6—Response to Search Report dated May 18, 2015, 25 pages.
TW 101140149—Notice of Allowance dated Sep. 17, 2015, 2 pages.
CN 2012800585457—First Office Action dated Feb. 29, 2016, 12 pages.
TW 104134542—Notice of Allowance dated Dec. 13, 2016, 3 pages.
CN 2012800585457—Second Office Action dated Nov. 1, 2016, 11 pages.
U.S. Appl. No. 14/564,586—Response to Office Action dated Jul. 22, 2015 filed , 6 pages.
U.S. Appl. No. 14/564,586—Final Office Action dated Apr. 21, 2016, 10 pages.
U.S. Appl. No. 14/564,586—Response to Final Office Action dated Apr. 21, 2016 filed May 13, 2016, 17 pages.
U.S. Appl. No. 13/374,335—Office Action dated Jan. 14, 2015, 19 pages.
U.S. Appl. No. 13/374,335—Response to Office Action dated Jan. 14, 2015 filed May 12, 2015, 15 pages.
U.S. Appl. No. 13/374,335—Response to Final Office Action dated Jun. 1, 2015 filed Oct. 1, 2015, 8 pages.
U.S. Appl. No. 13/374,335—Office Action dated Apr. 16, 2014, 18 pages.
U.S. Appl. No. 13/374,335—Response to Office Action dated Apr. 16, 2014 filed Aug. 18, 2014, 14 pages.
U.S. Appl. No. 13/374,335—Office Action dated Feb. 21, 2013, 12 pages.
U.S. Appl. No. 13/374,335—Response to Office Action dated Feb. 21, 2013 filed Jul. 19, 2013, 13 pages.
U.S. Appl. No. 13/374,335—Final Office Action dated Sep. 16, 2014, 14 pages.
U.S. Appl. No. 13/374,335—Response to Final Office Action dated Sep. 16, 2014 filed Dec. 16, 2014, 14 pages.
U.S. Appl. No. 13/374,335—Final Office Action dated Aug. 7, 2013, 18 pages.
U.S. Appl. No. 13/374,335—Response to Final Office Action dated Aug. 7, 2013 filed Jan. 13, 2013, 12 pages.

* cited by examiner

METHOD AND APPARATUS FOR FLOATING OR APPLYING VOLTAGE TO A WELL OF AN INTEGRATED CIRCUIT

REFERENCE TO PRIORITY APPLICATIONS

This application is a continuation of U.S. patent application Ser. No. 13/374,335, filed 22 Dec. 2011 and claims the benefit of U.S. Provisional Application No. 61/555,864 filed Nov. 4, 2011. Both applications are incorporated herein by reference.

BACKGROUND

Field

The present technology relates to methods and apparatuses for improving the biasing of well bias arrangements, which can lower leakage current and overall power consumption of integrated circuits.

Description of Related Art

The p-type well and the n-type well of integrated circuits are biased such that the source/drain-well junction in the p-type well, and the source/drain-well junction in the n-type well, are reverse biased, or at least not forward biased.

For example, an n-type transistor in a p-type well has n+-doped source and drain regions. Because a forward-biased junction is associated with high current and a reverse-biased junction is associated with low current, the junction between the p-type well and the n+-doped drain region of the n-type transistor is reverse biased by applying the lowest available voltage to the p-type well, such as a ground voltage, or the voltage applied to the n+-doped source region of the n-type transistor.

Similarly, a p-type transistor in an n-type well has p+-doped source and drain regions. Again, because a forward-biased junction is associated with high current and a reverse-biased junction is associated with low current, the junction between the n-type well and the p+-doped source region is reverse biased by applying the highest available voltage to the n-type well, such as a supply voltage, or the voltage applied to the p+-doped source region.

SUMMARY

Various embodiments are directed to various well bias arrangements.

In one well bias arrangement, no well bias voltage is applied to the n-well, and no well bias voltage is applied to the p-well. Because no external well bias voltage is applied, the n-well and the p-well are floating, even during operation of the devices in the n-well and the p-well.

In another well bias arrangement, the lowest available voltage is not applied to the p-well, such as a ground voltage, or the voltage applied to the n+-doped source region of the n-type transistor in the p-well. This occurs even during operation of the n-type transistor in the p-well.

In yet another well bias arrangement, the highest available voltage is not applied to the n-well, such as a supply voltage, or the voltage applied to the p+-doped source region of the p-type transistor in the n-well. This occurs even during operation of the p-type transistor in the n-well.

Various aspects of the technology are discussed in further detail below.

One aspect of the technology is an integrated circuit, comprising a substrate, an n-well in the substrate, a device in the n-well, a p-well in the substrate, a device in the p-well, and biasing circuitry providing all bias voltages required by the device in the n-well and the device in the p-well for operation. Examples of such devices include transistors, such as a p-type transistor in the n-well, an n-type transistor in the p-well, and other integrated circuit devices. The biasing circuitry provides the bias voltages during operation of the device in the n-well and the device in the p-well, as follows: (i) the biasing circuitry applies a bias voltage arrangement to the device in the n-well and the device in the p-well, (ii) no well bias voltage is applied by the biasing circuitry to the n-well, and (iii) no well bias voltage is applied by the biasing circuitry to the p-well.

In one embodiment, no well bias voltage is applied by the biasing circuitry to the n-well such that the n-well floats during operation of the device in the n-well, and no well bias voltage is applied by the biasing circuitry to the p-well such that the p-well floats during operation of the device in the p-well. In one embodiment, the circuit includes an electrical connection receiving no bias voltage applied by the biasing circuitry, and the electrical connection is shared by the n-well and the p-well such that the n-well and the p-well float together. In one embodiment, no electrical connection is shared by the n-well and the p-well such that the n-well and the p-well float separately.

In one embodiment, the circuit includes an electrical interconnection shared by the n-well and the p-well, and no well bias voltage is applied by the biasing circuitry to the electrical interconnection.

In one embodiment, the n-well has an n-well contact, the p-well has a p-well contact, and the circuit includes an electrical interconnection electrically connected to the n-well contact and the p-well contact such that the electrical interconnection is shared by the n-well and the p-well, and no well bias voltage is applied by the biasing circuitry to the electrical interconnection.

In one embodiment, the device in the n-well and the device in the p-well have device contacts receiving the bias voltage arrangement from the biasing circuitry, and the n-well and the p-well have no well contacts.

In one embodiment, the circuit includes electrical interconnections between (i) the biasing circuitry and (ii) the device in the n-well and the device in the p-well. The circuit includes no electrical interconnections between (i) the biasing circuitry and (ii) the n-well and the p-well.

Another aspect of the technology is an integrated circuit, comprising a substrate, a p-well in the substrate, an n-type transistor in the p-well, electrical interconnections, and biasing circuitry. The n-type transistor in the p-well includes an n-type source and an n-type drain in the p-well. The electrical interconnections are between the biasing circuitry and each of: the p-well, the n-type source, and the n-type drain.

During operation of the n-type transistor, the biasing circuitry applies a bias voltage arrangement to the electrical interconnections. The bias voltage arrangement includes: a source voltage applied to the n-type source, a drain voltage applied to the n-type drain, and a well voltage applied to the p-well. The well voltage is intermediate between the source voltage and the drain voltage.

In one embodiment, the bias voltage arrangement includes a forward bias applied to the p-well with respect to at least one of the n-type source and the n-type drain.

A further aspect of the technology is an integrated circuit, comprising a substrate, an n-well in the substrate, a p-type transistor in the n-well, electrical interconnections, and biasing circuitry. The p-type transistor in the n-well includes a p-type source and a p-type drain in the n-well. The electrical interconnections are between biasing circuitry and each of: the n-well, the p-type source, and the p-type drain.

During operation of the p-type transistor, the biasing circuitry applies a bias voltage arrangement to the electrical interconnections. The bias voltage arrangement includes: a source voltage applied to the p-type source, a drain voltage applied to the p-type drain, and a well voltage applied to the n-well. The well voltage is intermediate between the source voltage and the drain voltage.

In one embodiment, the bias voltage arrangement includes a forward bias applied to the n-well with respect to at least one of the p-type source and the p-type drain.

Yet another aspect of the technology is an integrated circuit, comprising a substrate, an n-well in the substrate, a p-type transistor in the n-well (including a p-type source and a p-type drain in the n-well), a p-well in the substrate, an n-type transistor in the p-well (including an n-type source and an n-type drain in the p-well), electrical interconnections, and biasing circuitry. The electrical interconnections are between biasing circuitry and each of: the n-well, the p-type source, the p-type drain, the p-well, the n-type source, and the n-type drain.

During operation of the p-type transistor and the n-type transistor, the biasing circuitry applies a bias voltage arrangement to the electrical interconnections. The bias voltage arrangement includes: (i) a first source voltage applied to the n-type source; (ii) a first drain voltage applied to the n-type drain; (iii) a first well voltage applied to the p-well, the first well voltage being intermediate between the first source voltage and the first drain voltage; (iv) a second source voltage applied to the p-type source; (v) a second drain voltage applied to the p-type drain; and (vi) a second well voltage applied to the n-well, the second well voltage being intermediate between the second source voltage and the second drain voltage.

In one embodiment, the bias voltage arrangement includes a forward bias applied to the p-well with respect to at least one of the n-type source and the n-type drain.

In one embodiment, the bias voltage arrangement includes a forward bias applied to the n-well with respect to at least one of the p-type source and the p-type drain.

In one embodiment, the first well voltage applied to the p-well and the second well voltage applied to the n-well are equal.

In one embodiment, the first well voltage applied to the p-well and the second well voltage applied to the n-well are different.

Other aspects are directed to a computer readable medium storing computer instructions to perform a method of designing an integrated circuit, the method for use by a computer system having a processor and memory. The computer instructions are executable by the computer system to design the integrated circuit as described herein.

Other aspects are directed to a computer system designing an integrated circuit, comprising a processor and memory, configured to design an integrated circuit as described herein.

Other aspects are directed to a method of operating an integrated circuit as described herein.

DETAILED DESCRIPTION

Figure 1:
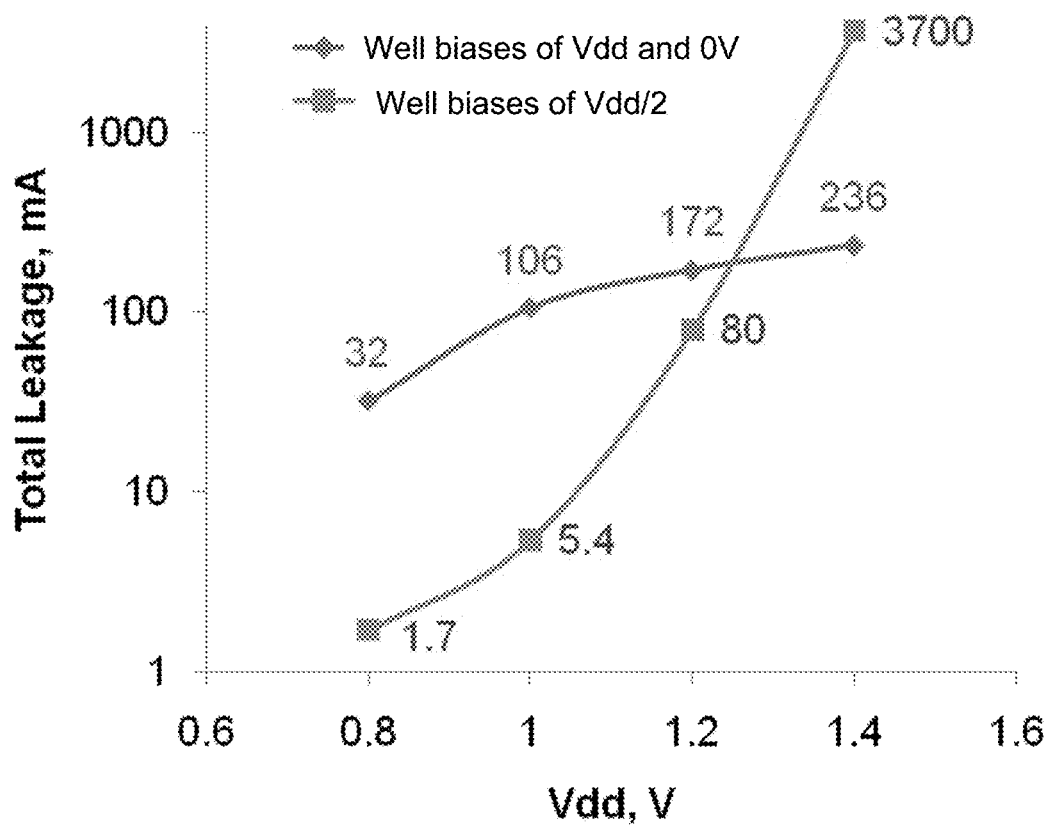
FIG. 1 is a graph showing variations in leakage current with supply voltage, for two well bias arrangements—a first well bias arrangement of well bias voltages of Vdd and 0V applied respectively to the n-type well and the p-type well, and a second well bias arrangement of the well bias voltage Vdd/2 applied to the n-type well and the p-type well.

FIG. 1 is a graph showing variations in leakage current with supply voltage, for two well bias arrangements—a first well bias arrangement of well bias voltages of Vdd and 0V applied respectively to the n-type well and the p-type well, and a second well bias arrangement of the well bias voltage Vdd/2 applied to the n-type well and the p-type well.

For the first well bias arrangement of well bias voltages of Vdd and 0V applied respectively to the n-type well and the p-type well, as the supply voltage Vdd drops through 1.4V, 1.2V, 1V, and 0.8V, the total leakage current drops through 236 mA, 172 mA, 106 mA, and 32 mA.

For the second well bias arrangement of the well bias voltage Vdd/2 applied to the n-type well and the p-type well, as the supply voltage Vdd drops through 1.4V, 1.2V, 1V, and 0.8V, the total leakage current drops through 3700 mA, 80 mA, 5.4 mA, and 1.7 mA.

Around the supply voltage 1.2V or less, total leakage current is better with the second well bias arrangement than the first well bias arrangement. For example: (i) at Vdd=1.2V, there is a 2× difference in improved, decreased total leakage; (ii) at Vdd=1V, there is a 20× difference in improved, decreased total leakage; (iii) at Vdd=0.8V, there is a 20× difference in improved, decreased total leakage.

Figure 2:
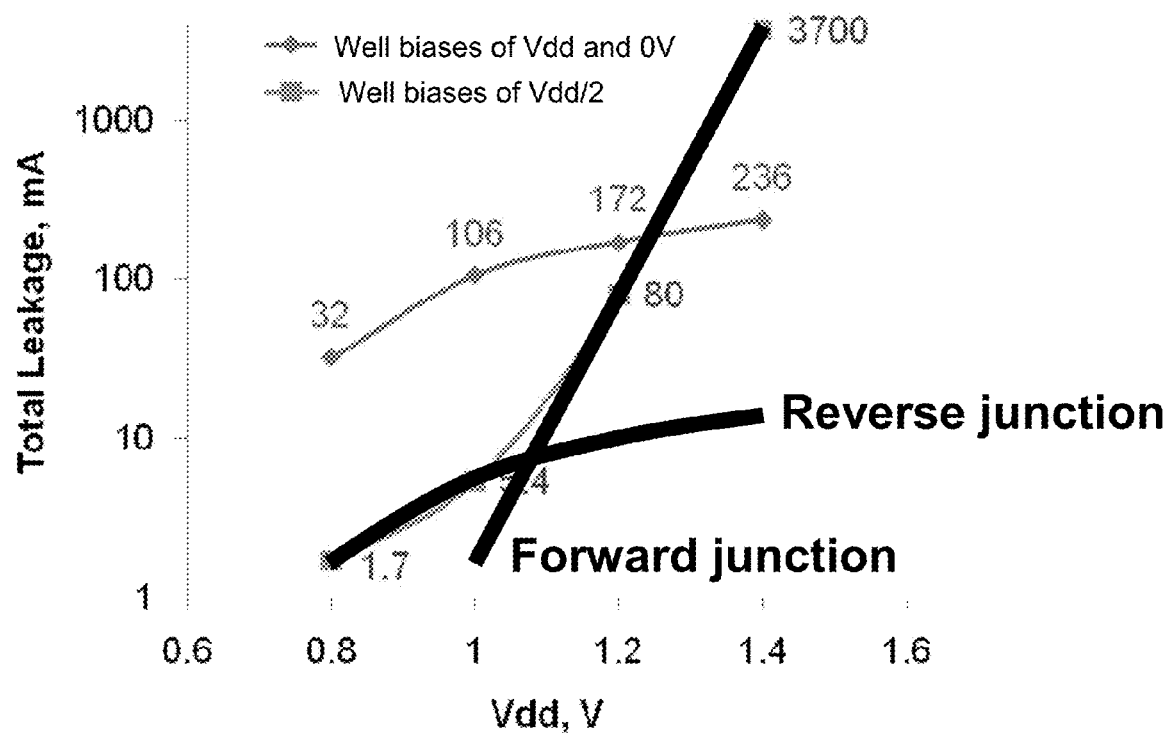
FIG. 2 shows the graph of FIG. 1 showing variations in leakage current with supply voltage, overlaid with the forward and reverse leakage components on the curve corresponding to the well bias arrangement of the well bias voltage Vdd/2 applied to the n-type well and the p-type well.

FIG. 2 shows the graph of FIG. 1 showing variations in leakage current with supply voltage, overlaid with the forward and reverse leakage components on the curve corresponding to the well bias arrangement of the well bias voltage Vdd/2 applied to the n-type well and the p-type well.

Around the supply voltage 1.1V or more, total leakage current is dominated by forward junction leakage current. Forward leakage is exponential versus bias. Around the supply voltage 1.1V or less, total leakage current is dominated by reverse junction leakage current. Reverse leakage is mainly due to band-to-band tunneling.

Figure 3:
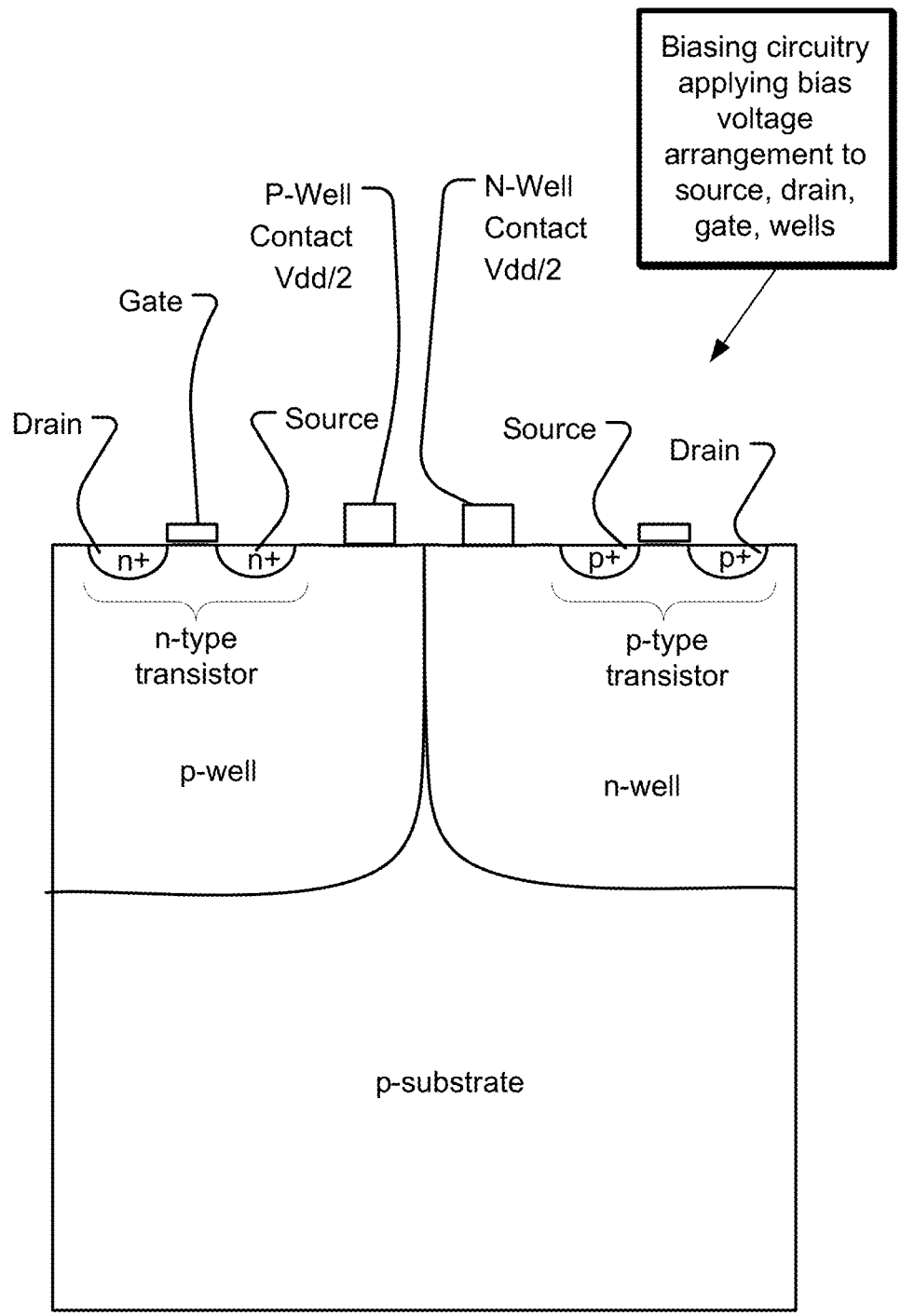
FIG. 3 shows an n-type transistor in a p-type well, and a p-type transistor in an n-type well, where the p-type well and the n-type well receive well bias voltages from the well contacts of Vdd/2 (half the supply voltage, or half the voltage applied to n-type transistor drain, or half the voltage applied to p-type transistor source).

FIG. 3 shows the n-type transistor and p-type transistor whose various associated doping, potential, and current densities are shown in subsequent figures.

In particular, FIG. 3 shows an n-type transistor in a p-type well, and a p-type transistor in an n-type well, where the p-type well and the n-type well receive well bias voltages from the well contacts of Vdd/2 (half the supply voltage, or half the voltage applied to n-type transistor drain, or half the voltage applied to p-type transistor source). Biasing circuitry applies a bias voltage arrangement to the sources, drains, gates, and wells.

Figure 4:
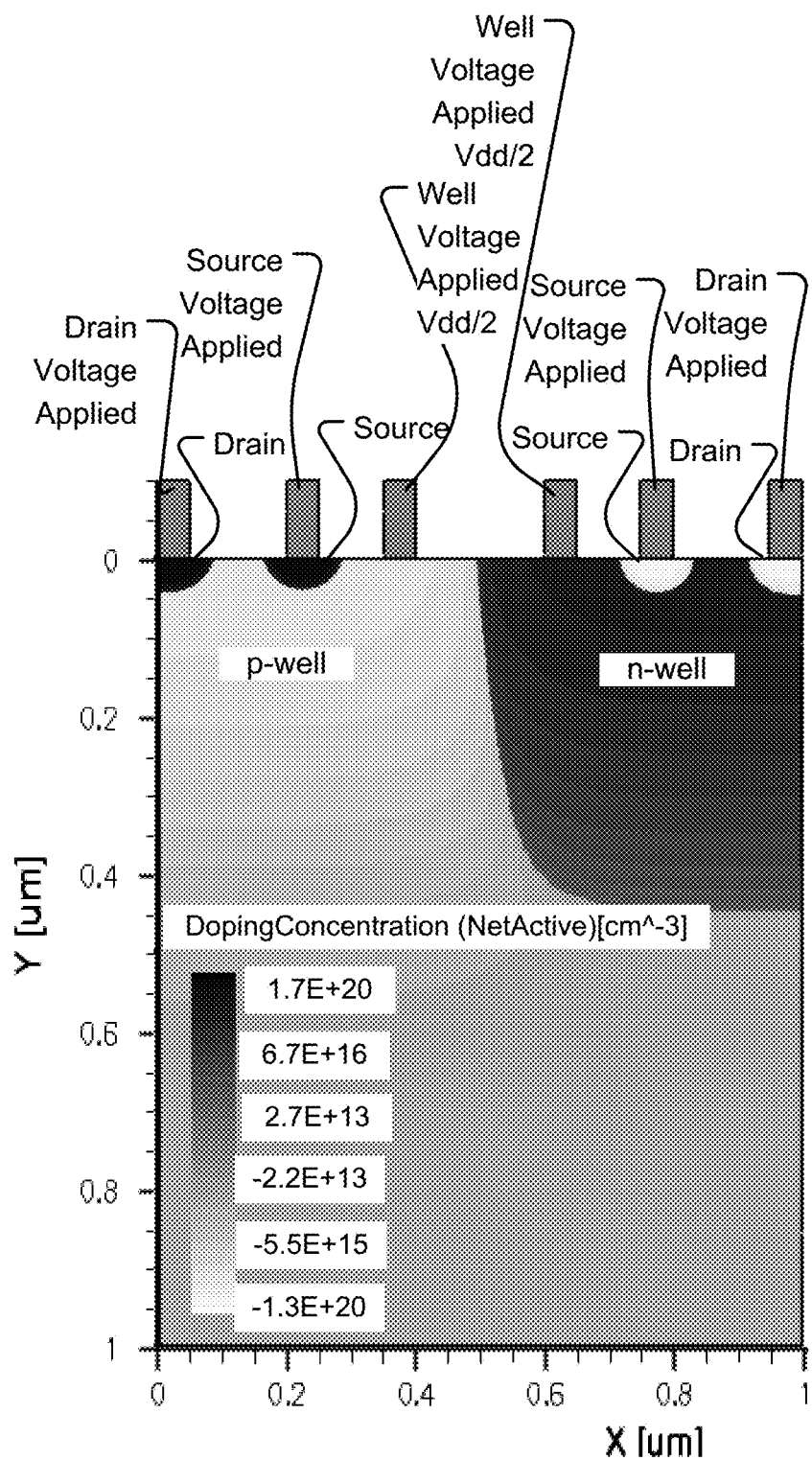
FIG. 4 shows a graph of the doping concentrations of the substrate, wells, and transistor sources and drains of FIG. 3.

FIG. 4 shows a graph of the doping concentrations of the substrate, wells, and transistor sources and drains of FIG. 3.

The positive values mean n-type doping concentrations, and the negative values mean p-type doping concentrations. The positive value of $1.7 \times 10^{20}$ cm$^{-3}$ corresponds with the n+-doped source and drain of the n-type transistor. The negative value of $-1.3 \times 10^{20}$ cm$^{-3}$ corresponds with the p+-doped source and drain of the n-type transistor. In both the p-well and the n-well, the doping concentrations fall off quickly with well depth.

The post-shaped contacts are electrical interconnections that apply a bias voltage arrangement of the biasing circuitry. On the p-well side, electrical interconnections apply a drain voltage and a source voltage of the n-type transistor and a p-well bias voltage Vdd/2. The gate of the n-type transistor is not shown. On the n-well side, electrical interconnections apply a drain voltage and a source voltage of the p-type transistor and an n-well bias voltage Vdd/2. The gate of the p-type transistor is not shown.

Figure 5:
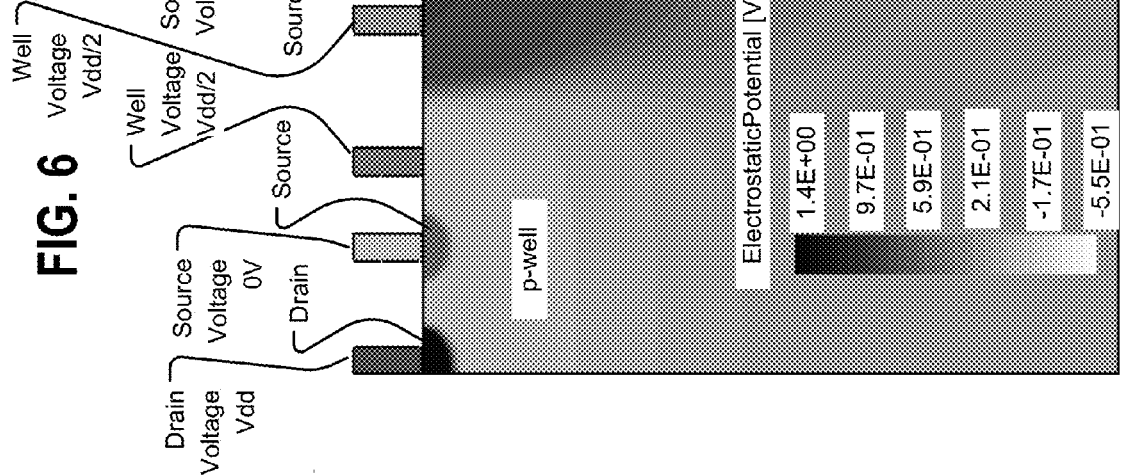
FIG. 5 shows a graph of the voltages of the substrate, wells, and transistor sources and drains of FIG. 3, when a ground voltage is applied as the well bias voltage of the p-type well and Vdd (supply voltage, or voltage applied to n-type transistor drain, or the voltage applied to p-type transistor source) is applied as the well bias voltage of the n-type well.

FIG. 5 shows a graph of the voltages of the substrate, wells, and transistor sources and drains of FIG. 3, when a ground voltage is applied as the well bias voltage of the p-type well and Vdd (supply voltage, or voltage applied to n-type transistor drain, or the voltage applied to p-type transistor source) is applied as the well bias voltage of the n-type well.

Several junctions are reverse biased relatively strongly (compared to the next figure): p-well/n-well, p-well/n+-doped drain, n-well/p+-doped drain. Reverse bias refers to the external voltages applied by the biasing circuitry via the electrical interconnections, such that the external voltages apply a lower voltage to the p-doped side than the n-doped side.

The simulation has a supply voltage Vdd of 0.8V. The well bias voltage of Vdd or 0.8 V is applied to the n-well, and the well bias voltage of 0V is applied to the p-well. The actual well voltages shift from the well bias voltages applied by the electrical interconnections, because of the built-in voltage which results from doping. The effects of built-in voltage increase with the p-type and n-type doping concentrations. As a result of built-in voltage, the actual voltage of the most highly p-doped areas of the p-well shifts from the applied well bias voltage of 0V to an actual p-well voltage of −0.55V, and the actual voltage of the most highly n-doped areas of the n-well shifts from the applied well bias voltage of 0.8V to an actual n-well voltage of 1.4V.

Figure 6:
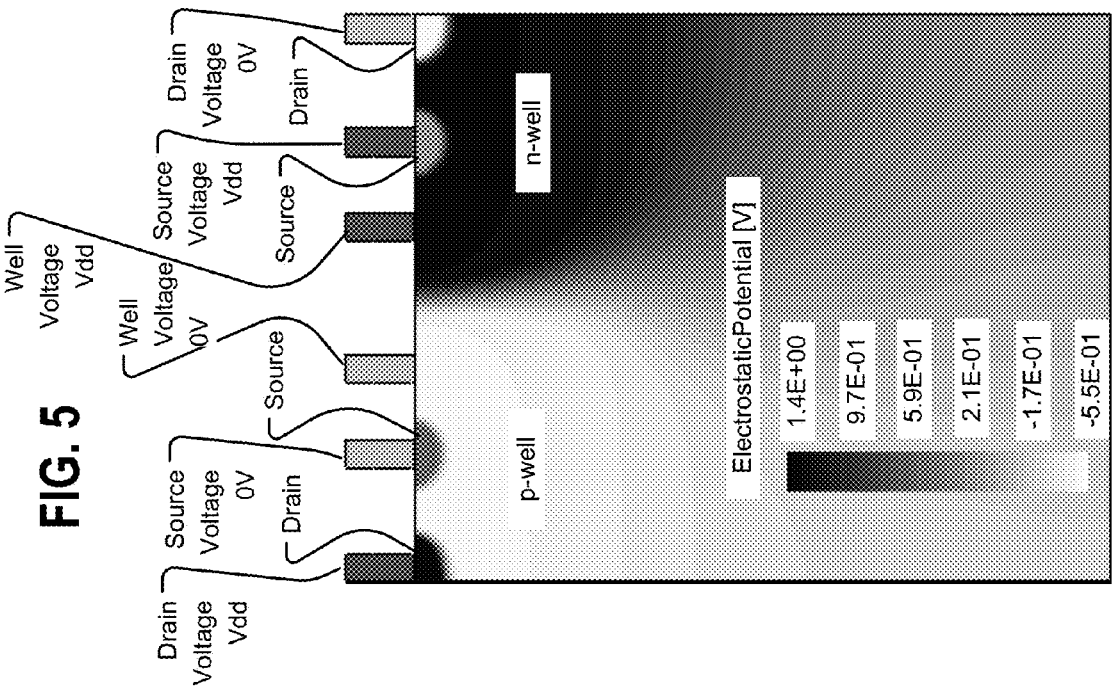
FIG. 6 shows a graph of the voltages of the substrate, wells, and transistor sources and drains of FIG. 3, where the p-type well and the n-type well receive well bias voltages from the well contacts of Vdd/2 (half the supply voltage, or half the voltage applied to n-type transistor drain, or half the voltage applied to p-type transistor source).

FIG. 6 shows a graph of the voltages of the substrate, wells, and transistor sources and drains of FIG. 3, where the p-type well and the n-type well receive well bias voltages from the well contacts of Vdd/2 (half the supply voltage, or half the voltage applied to n-type transistor drain, or half the voltage applied to p-type transistor source).

The simulation has a supply voltage Vdd of 0.8V. The well bias voltage of Vdd/2 or 0.4 V is applied to the n-well, and the well bias voltage of Vdd/2 or 0.4V is applied to the p-well. Because zero bias is applied across the p-well and n-well due to the same well bias voltage being applied to the p-well and n-well, actual well voltage differences result from built-in voltage. As a result of built-in voltage, the actual voltage of the most highly p-doped areas of the p-well shifts from the applied well bias voltage of 0.4 V to an actual p-well voltage of −0.15V, and the actual voltage of the most highly n-doped areas of the n-well shifts from the applied well bias voltage of 0.4V to an actual n-well voltage of 1.0V.

Several junctions are reverse biased relatively weakly (compared to the prior figure): p-well/n-well, p-well/n+-doped drain, n-well/p+-doped drain. Reverse bias refers to the external voltages applied by the biasing circuitry via the electrical interconnections, such that the external voltages apply a lower voltage to the p-doped side than the n-doped side.

Several junctions are forward biased weakly: p-well/n+-doped source, n-well/p+-doped source. Forward bias refers to the external voltages applied by the biasing circuitry via the electrical interconnections, such that the external voltages apply a higher voltage to the p-doped side than the n-doped side.

Figure 7:
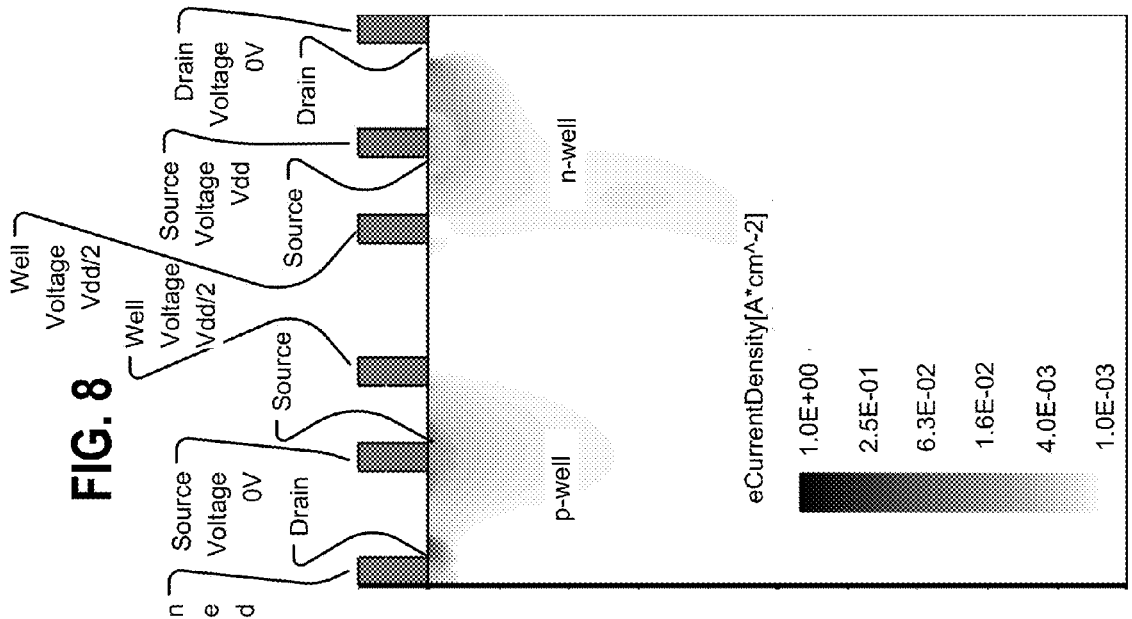
FIG. 7 shows a graph of the electron current density of the substrate, wells, and transistor sources and drains of FIG. 3 and corresponding voltages of FIG. 5, when a ground voltage is applied as the well bias voltage of the p-type well and Vdd (supply voltage, or voltage applied to n-type transistor drain, or the voltage applied to p-type transistor source) is applied as the well bias voltage of the n-type well.

FIG. 7 shows a graph of the electron current density of the substrate, wells, and transistor sources and drains of FIG. 3 and corresponding voltages of FIG. 5, when a ground voltage is applied as the well bias voltage of the p-type well and Vdd (supply voltage, or voltage applied to n-type transistor drain, or the voltage applied to p-type transistor source) is applied as the well bias voltage of the n-type well.

The leakage current is band-to-band tunneling current from the reverse biased junctions of p-well/n+-doped drain, and n-well/p+-doped drain. Accordingly, high electron current density is in the n+-doped drain, and in the n-well between the p+-doped drain and the electrical interconnection receiving the n-well bias voltage.

Figure 8:
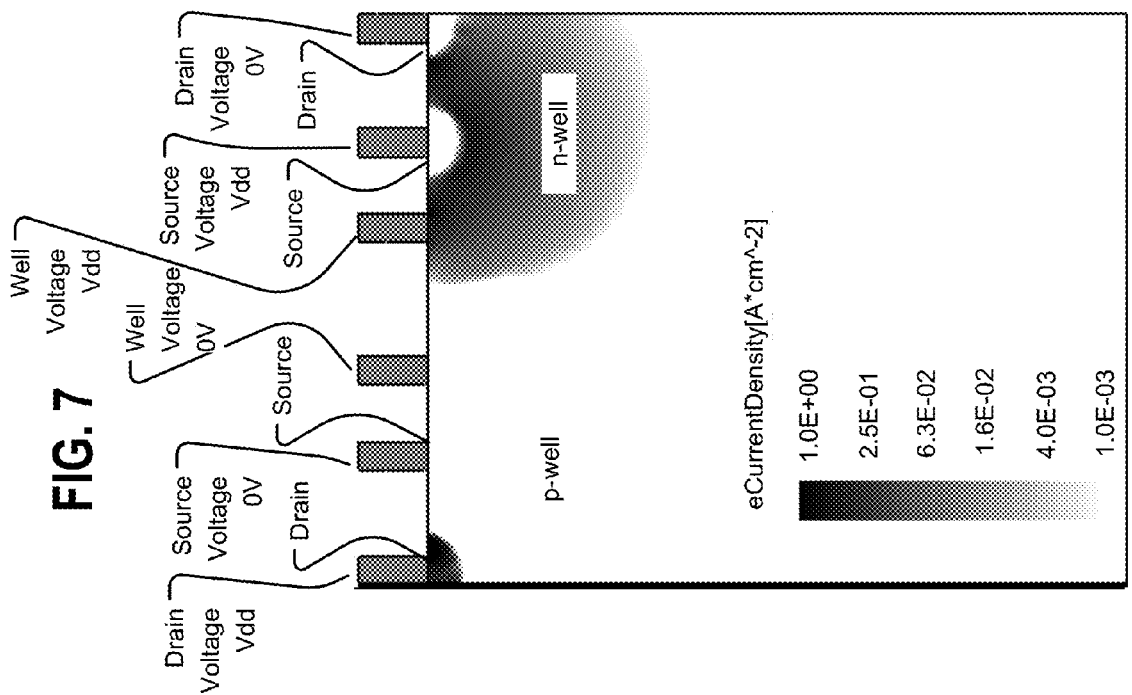
FIG. 8 shows a graph of the electron current density of the substrate, wells, and transistor sources and drains of FIG. 3 and corresponding voltages of FIG. 6, where the p-type well and the n-type well receive well bias voltages from the well contacts of Vdd/2 (half the supply voltage, or half the voltage applied to n-type transistor drain, or half the voltage applied to p-type transistor source).

FIG. 8 shows a graph of the electron current density of the substrate, wells, and transistor sources and drains of FIG. 3 and corresponding voltages of FIG. 6, where the p-type well and the n-type well receive well bias voltages from the well contacts of Vdd/2 (half the supply voltage, or half the voltage applied to n-type transistor drain, or half the voltage applied to p-type transistor source).

The sources and locations of the band-to-band tunneling current from the reverse biased junctions of p-well/n+-doped drain, and n-well/p+-doped drain, are the same as the prior figure. However, because the amount of reverse bias is halved, the magnitudes of the high electron current density are decreased.

An additional source of leakage current is the forward biased junction current from the forward biased junction of the p-well/n+-doped source. However, the electron current density in the n+-doped source is negligible, indicating that the leakage contribution of the forward biased junction is negligible.

Figure 9:
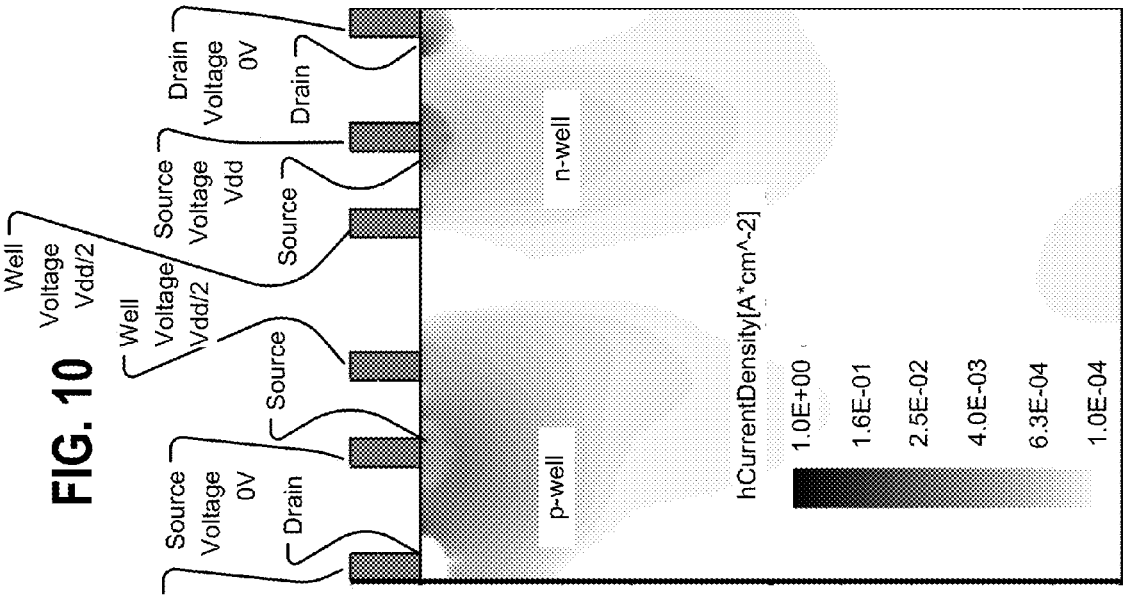
FIG. 9 shows a graph of the hole current density of the substrate, wells, and transistor sources and drains of FIG. 3 and corresponding voltages of FIG. 5, when a ground voltage is applied as the well bias voltage of the p-type well and Vdd (supply voltage, or voltage applied to n-type transistor drain, or the voltage applied to p-type transistor source) is applied as the well bias voltage of the n-type well.

FIG. 9 shows a graph of the hole current density of the substrate, wells, and transistor sources and drains of FIG. 3 and corresponding voltages of FIG. 5, when a ground voltage is applied as the well bias voltage of the p-type well and Vdd (supply voltage, or voltage applied to n-type transistor drain, or the voltage applied to p-type transistor source) is applied as the well bias voltage of the n-type well.

The leakage current is band-to-band tunneling current from the reverse biased junctions of p-well/n+-doped drain, and n-well/p+-doped drain. Accordingly, high hole current density is in the p+-doped drain, and in the p-well between the n+-doped drain and the electrical interconnection receiving the p-well bias voltage.

Figure 10:
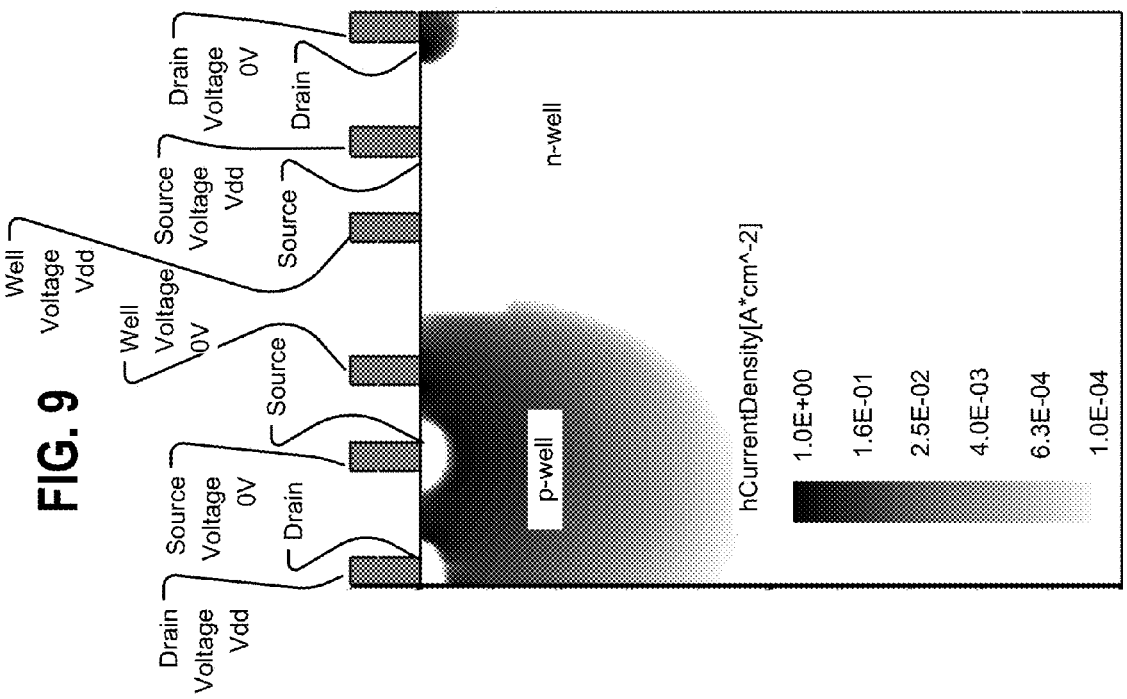
FIG. 10 shows a graph of the hole current density of the substrate, wells, and transistor sources and drains of FIG. 3 and corresponding voltages of FIG. 6, where the p-type well and the n-type well receive well bias voltages from the well contacts of Vdd/2 (half the supply voltage, or half the voltage applied to n-type transistor drain, or half the voltage applied to p-type transistor source).

FIG. 10 shows a graph of the hole current density of the substrate, wells, and transistor sources and drains of FIG. 3 and corresponding voltages of FIG. 6, where the p-type well and the n-type well receive well bias voltages from the well contacts of Vdd/2 (half the supply voltage, or half the voltage applied to n-type transistor drain, or half the voltage applied to p-type transistor source).

The sources and locations of the band-to-band tunneling current from the reverse biased junctions of p-well/n+-doped drain, and n-well/p+-doped drain, are the same as the prior figure. However, because the amount of reverse bias is halved, the magnitudes of the high hole current density are decreased.

An additional source of leakage current is the forward biased junction current from the forward biased junction of the n-well/p+-doped source. However, the hole current density in the p+-doped source is negligible, indicating that the leakage contribution of the forward biased junction is negligible.

Figure 11:
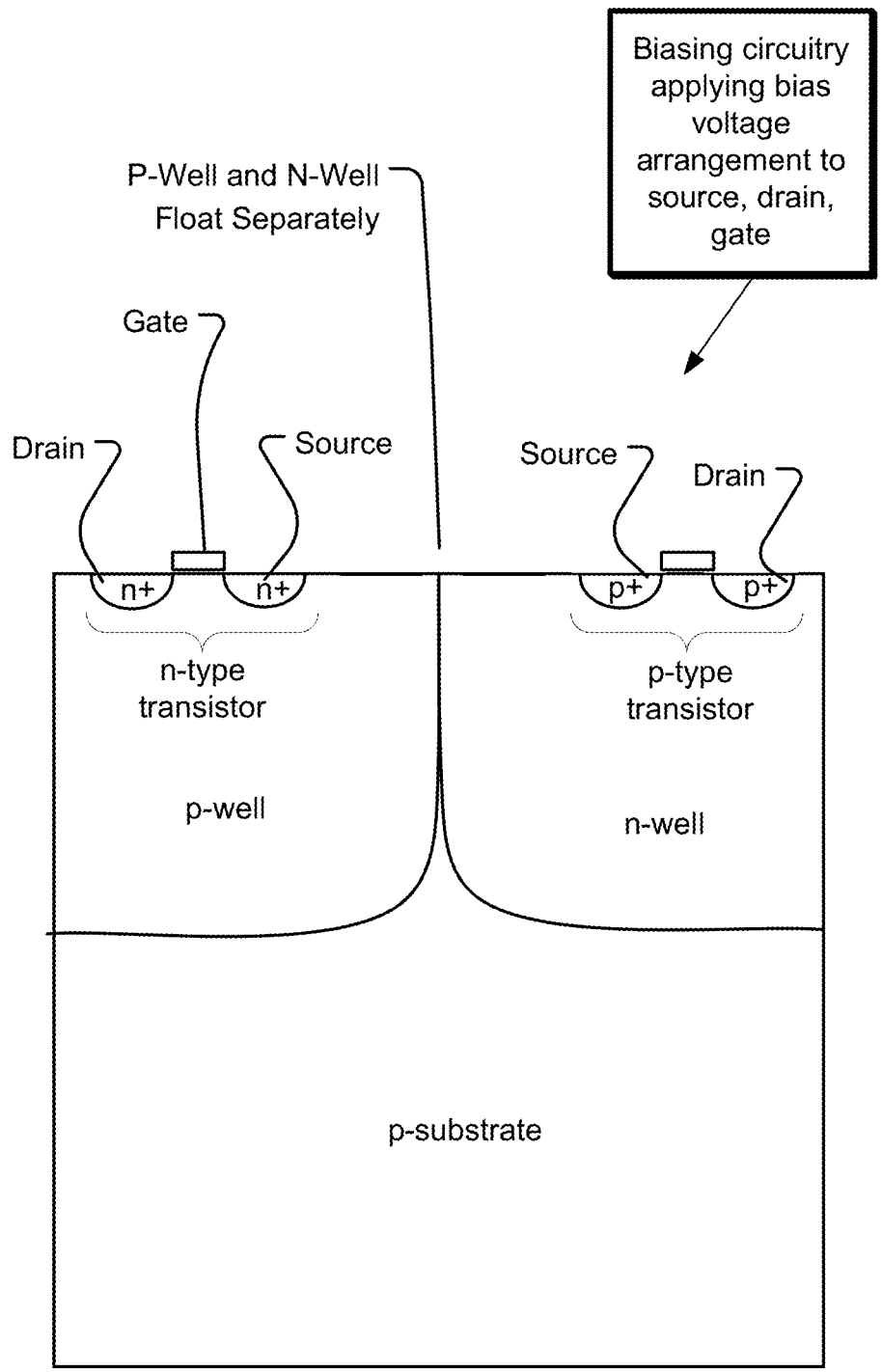
FIG. 11 shows an n-type transistor in a p-type well, and a p-type transistor in an n-type well, where the p-type well and the n-type well float separately (and do not receive well bias voltages from well contacts).

FIG. 11 shows an n-type transistor in a p-type well, and a p-type transistor in an n-type well, where the p-type well and the n-type well float separately (and do not receive well bias voltages from well contacts).

In particular, FIG. 11 shows an n-type transistor in a p-type well, and a p-type transistor in an n-type well, where the p-type well and the n-type well receive no well bias voltages. The p-well and the n-well float separately. Biasing circuitry applies a bias voltage arrangement to the sources, drains, and gates. The separately floating wells have a self-adapting balance of leakage currents.

Figure 12:
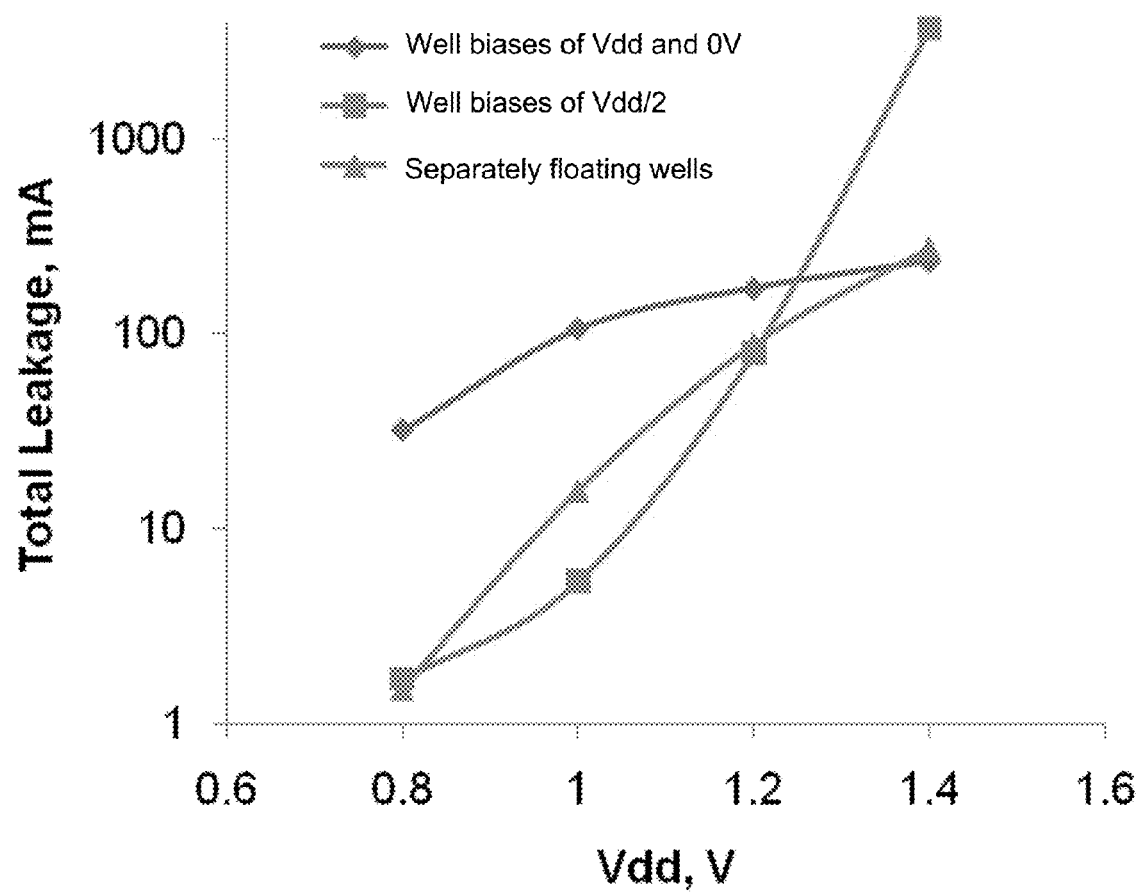
FIG. 12 shows the graph of FIG. 1 showing variations in leakage current with supply voltage, supplemented with a third well bias arrangement of the n-type well and the p-type well allowed to separately float, such that no well bias voltage is applied to the n-well and no well bias voltage is applied to the p-well.

FIG. 12 shows the graph of FIG. 1 showing variations in leakage current with supply voltage, supplemented with a third well bias arrangement of the n-type well and the p-type well allowed to separately float, such that no well bias voltage is applied to the n-well and no well bias voltage is applied to the p-well.

Around the supply voltage 1.4V or less, total leakage current is better with the third well bias arrangement than the first well bias arrangement (well bias voltages of Vdd and 0V applied respectively to the n-type well and the p-type well).

Around the supply voltage 1.2V or more, and 0.8V or less, total leakage current is better with the third well bias arrangement than the second well bias arrangement (well bias voltage Vdd/2 applied to the n-type well and the p-type well).

Between around the supply voltages of 0.8V and 1.2V, total leakage current is worse with the third well bias arrangement than the second well bias arrangement. However, the third well bias arrangement has an advantage that well contacts are not required, simplifying the layout.

Figure 13:
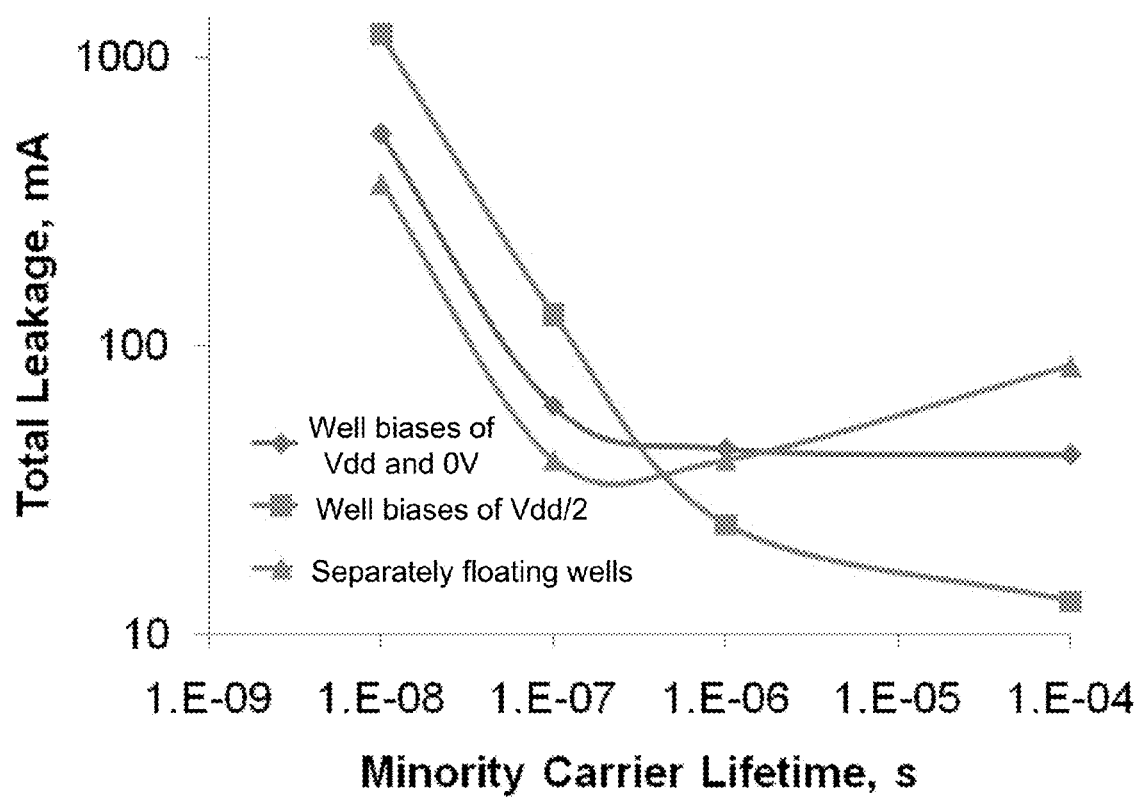
FIG. 13 is a graph showing variations in leakage current with silicon wafer quality, for three well bias arrangements—a first well bias arrangement of well bias voltages of Vdd and 0V applied respectively to the n-type well and the p-type well, a second well bias arrangement of the well bias voltage Vdd/2 applied to the n-type well and the p-type well, and a third well bias arrangement of the n-type well and the p-type well allowed to separately float such that no well bias voltage is applied to the n-well and no well bias voltage is applied to the p-well.

FIG. 13 is a graph showing variations in leakage current with silicon wafer quality, for three well bias arrangements—a first well bias arrangement of well bias voltages of Vdd and 0V applied respectively to the n-type well and the p-type well, a second well bias arrangement of the well bias voltage Vdd/2 applied to the n-type well and the p-type well, and a third well bias arrangement of the n-type well and the p-type well allowed to separately float such that no well bias voltage is applied to the n-well and no well bias voltage is applied to the p-well.

Minority carrier lifetime is a measure of silicon wafer quality, where clean silicon wafers have longer minority carrier lifetimes, and dirty silicon wafers have shorter minority carrier lifetimes. Standard silicon wafers, in between these extremes, have a minority carrier lifetime around in the upper decade of 10^-7 seconds, or around 50-100 microseconds.

The second well bias arrangement (well bias voltage Vdd/2 applied to the n-type well and the p-type well) shows the lowest total leakage with clean silicon wafers and much of standard silicon wafers. The third well bias arrangement (n-type well and the p-type well allowed to separately float) shows the lowest total leakage with dirty silicon wafers and some standard silicon wafers. The third well bias arrangement relies on some leakage to avoid building up excessive well biases.

Figure 14:
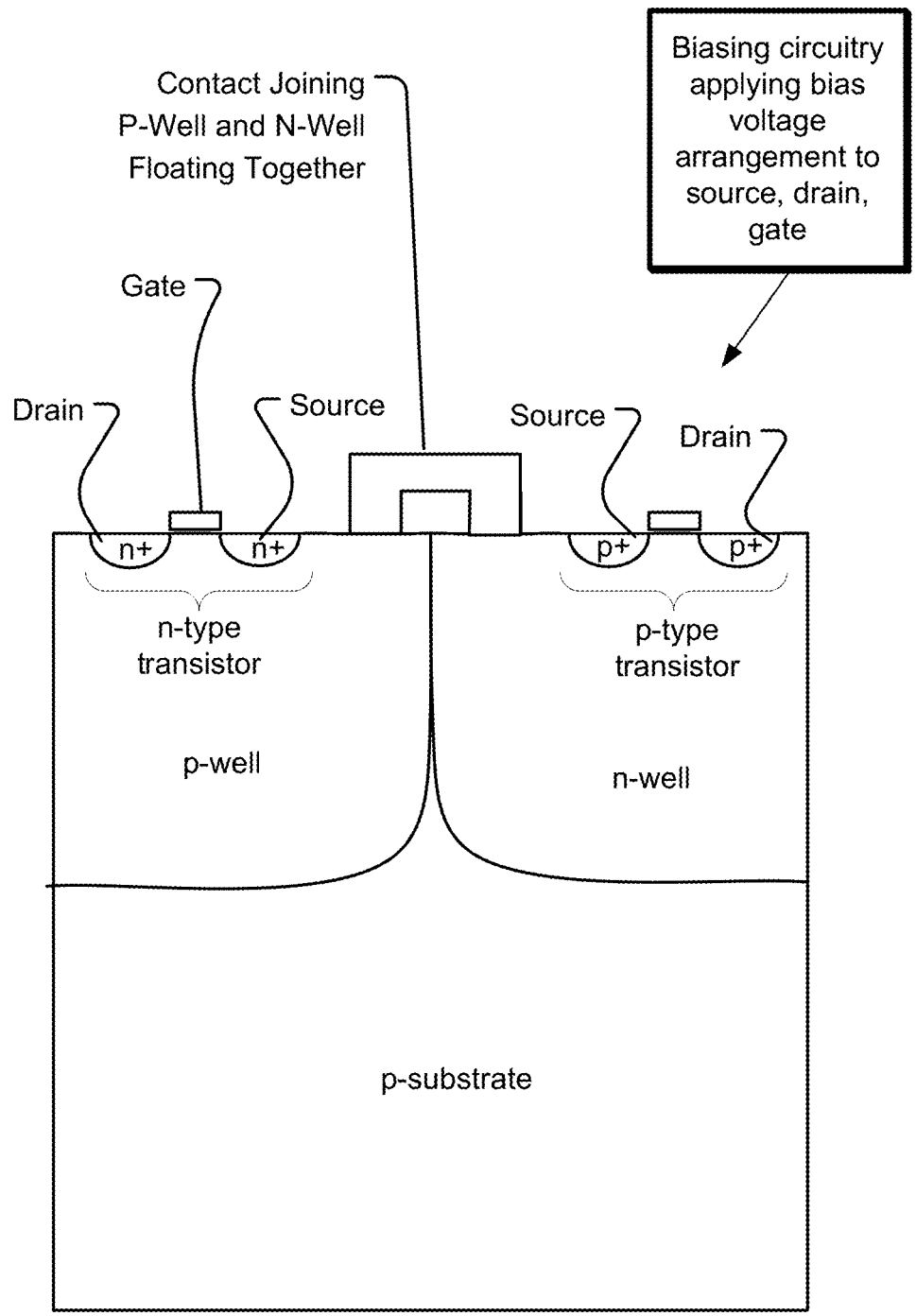
FIG. 14 shows an n-type transistor in a p-type well, and a p-type transistor in an n-type well, where the p-type well and the n-type well float together (and do not receive well bias voltages from well contacts), such as by joining the n-type well and the p-type well with a common electrical contact.

FIG. 14 shows an n-type transistor in a p-type well, and a p-type transistor in an n-type well, where the p-type well and the n-type well float together (and do not receive well bias voltages from well contacts), such as by joining the n-type well and the p-type well with a common electrical contact.

In particular, FIG. 14 shows an n-type transistor in a p-type well, and a p-type transistor in an n-type well, where the p-type well and the n-type well receive no well bias voltages. The p-well and the n-well float together. One example electrical interconnection between the p-well and the n-well is that the p-well and the n-well are connected together. Biasing circuitry applies a bias voltage arrangement to the sources, drains, and gates.

Figure 15:
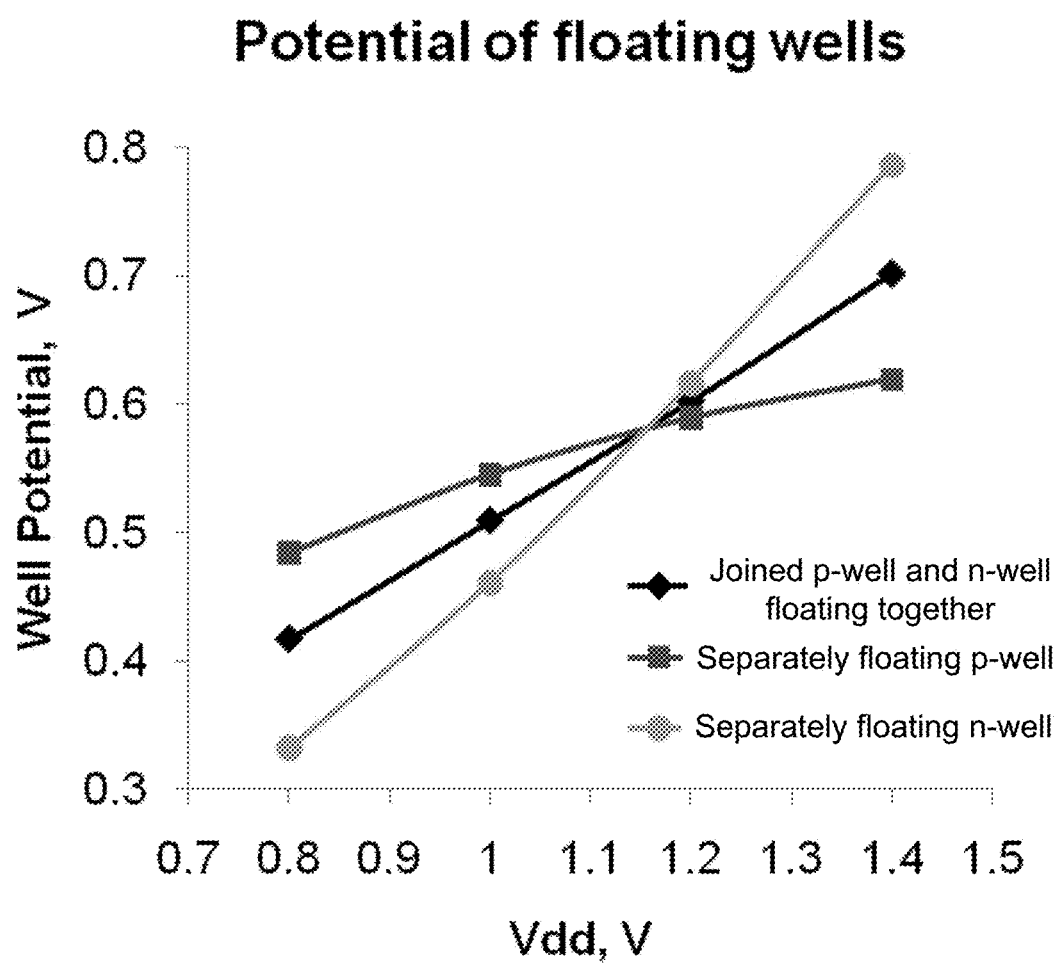
FIG. 15 is a graph of the well potential versus supply voltage for three types of wells—the separately floating n-type well, the separately floating p-type well, and the p-type well and the n-type well floating together.

FIG. 15 is a graph of the well potential versus supply voltage for three types of wells—the separately floating n-type well, the separately floating p-type well, and the p-type well and the n-type well floating together.

The joined p-well and n-well floating together finds a bias and a leakage that are nearly identical to the well bias arrangement of applying Vdd/2 to the p-well and n-well. Separately floating p-well and n-well find the following biases. Below supply voltage Vdd=1.2V, the p-well bias is higher than the n-well bias, and the band-to-band leakage current is dominant. At Vdd=1.2V, both of the well biases are about Vdd/2. Above Vdd=1.2V, the n-well bias is higher than the p-well bias, and the leakage from forward biased junction current dominant.

Figure 16:
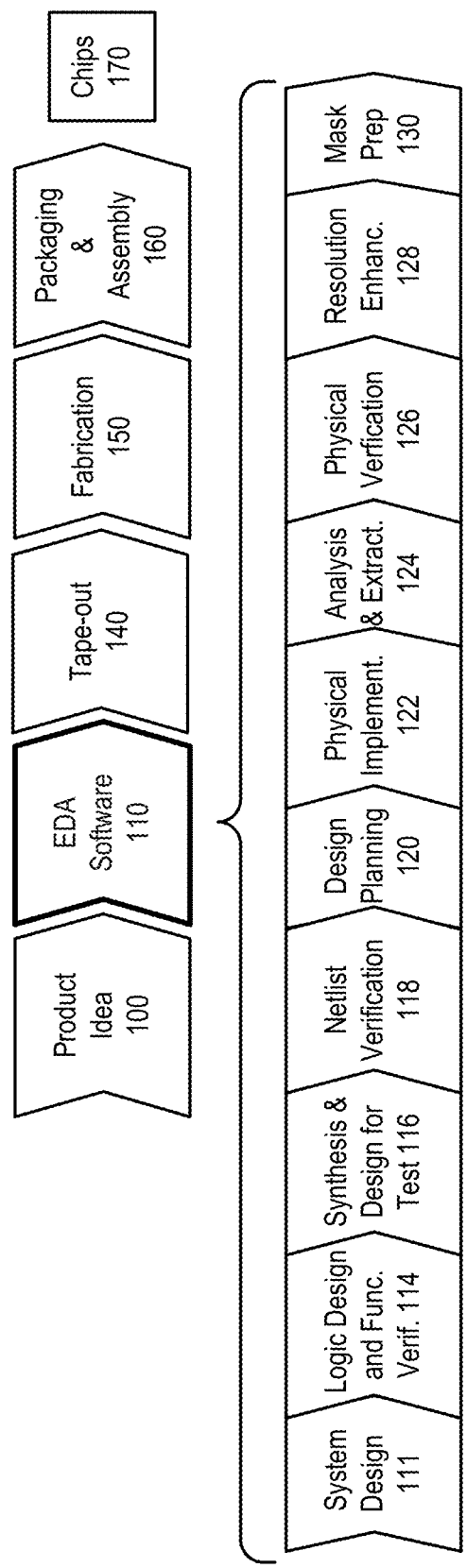
FIG. 16 shows a simplified representation of an illustrative integrated circuit design flow incorporating features of the technology.

FIG. 16 shows a simplified representation of an illustrative integrated circuit design flow incorporating features of the technology.

At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 111): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, IC Compiler, DFT Compiler, Power Compiler, FPGA Compiler, TetraMAX ATPG, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, PrimeTime, and Star RC products.

Physical verification (step 126): At this step various checking functions are performed to ensure correctness for: manufacturing, electrical issues, lithographic issues, and circuitry. Example EDA software products from Synopsys, Inc. that can be used at this step include the IC Validator product.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS® family of products.

Figure 17:
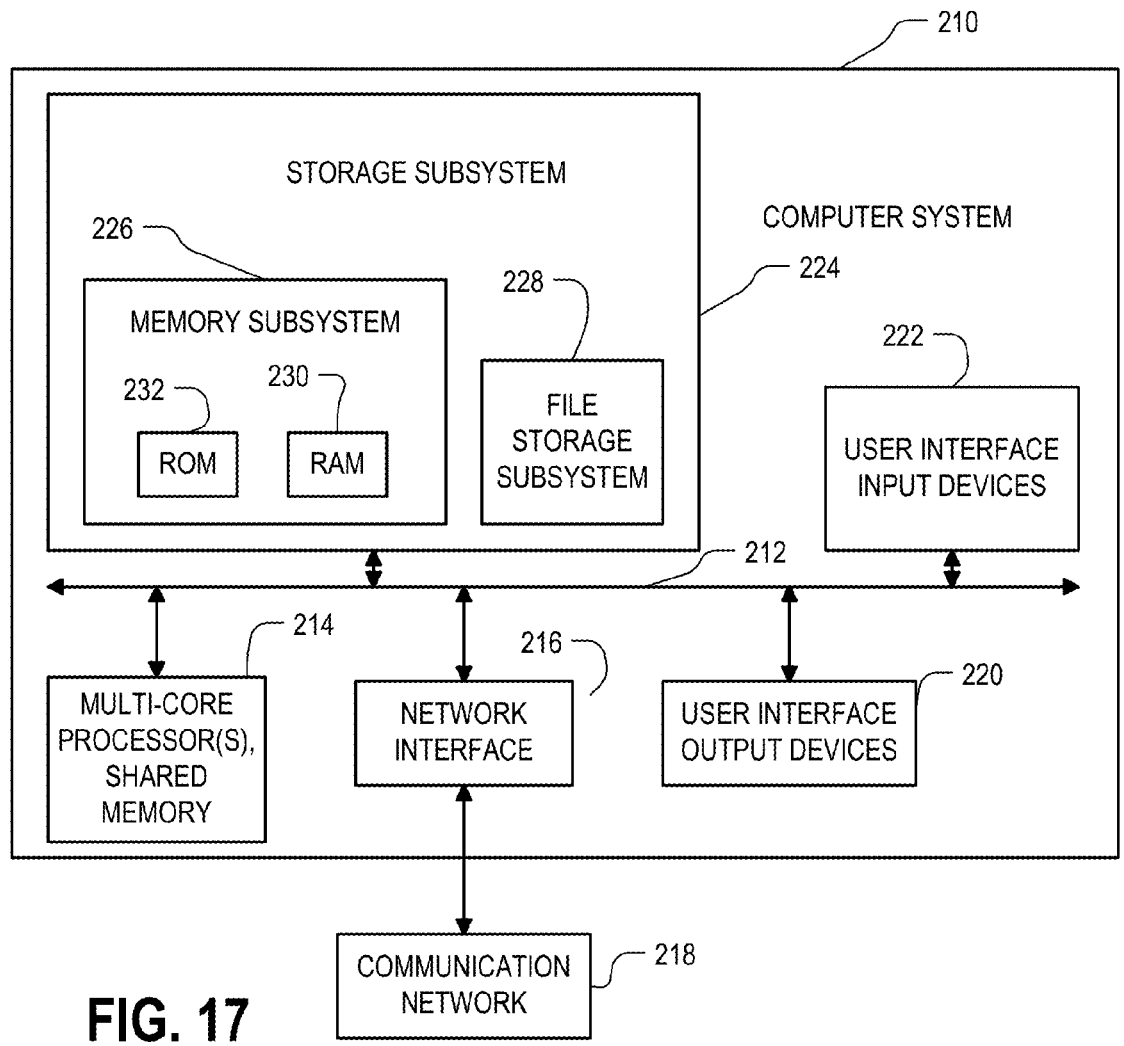
FIG. 17 is a simplified block diagram of a computer system that can be used to implement software incorporating aspects of the technology.

FIG. 17 is a simplified block diagram of a computer system that can be used to implement software incorporating aspects of the technology.

Computer system 210 typically includes a processor subsystem 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 210 or onto computer network 218.

User interface output devices 220 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The user interface output devices may also provide non visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of certain aspects of the present invention. For example, the various modules implementing the functionality of a circuit simulator and computer-implemented steps in the prior figures may be stored in storage subsystem 224. These software modules are generally executed by processor subsystem 214. The data constructs stored in the storage subsystem 224 also can include any technology files, macrocell libraries, layout files, and other databases mentioned herein. Note that in some embodiments, one or more of these can be stored elsewhere but accessibly to the computer system 210, for example via the communication network 218.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs (or may have been communicated to the computer system 210 via the communication network 218), and may be stored by file storage subsystem 228. The host memory 226 contains, among other things, computer instructions which, when executed by the processor subsystem 214, cause the computer system to operate or perform functions as described herein. As used herein, processes and software that are said to run in or on "the host" or "the computer", execute on the processor subsystem 214 in response to computer instructions and data in the host memory subsystem 226 including any other local or remote storage for such instructions and data.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, or any other data processing system or user device. Due to the ever changing nature of computers and networks, the description of computer system 210 depicted is intended only as a specific example for purposes of illustrating the preferred embodiments of the present invention. Many other configurations of computer system 210 are possible having more or fewer components than the computer system depicted.

Figure 17A:
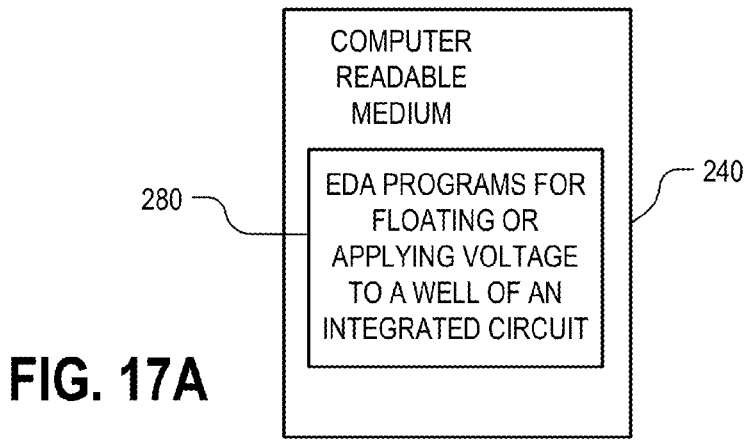
FIG. 17A is a simplified block diagram of a nontransitory computer readable medium storing computer executable instructions that implement software incorporating aspects of the technology.

FIG. 17A is a simplified block diagram of a nontransitory computer readable medium storing computer executable instructions that implement software incorporating aspects of the technology. Example software includes EDA software discussed herein, such as EDA programs for floating or applying voltage to a well of an integrated circuit, and/or other technology discussed herein.

Various discussed embodiments include the n-well and the p-well with twin tub technology. Other embodiments include an n-type substrate and a p-well, and a p-type substrate with an n-well. Other embodiments include triple-well or quadruple-well process technologies which comprise multiple isolated p-well regions nested within deep n-well structures, and/or multiple isolated n-well regions nested within deep p-well structures.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An EDA (electronic design automation) tool, comprising:
   a non-transitory memory device having stored thereon:
   computer executable instructions causing a computer to make a first layout for a circuit design, the first layout including a floating p-well including a first n-type transistor and a floating n-well including a first p-type transistor, and the first layout including a first junction between differently doped regions, the first junction beneath the floating p-well, between the floating p-well and an underlying substrate region, wherein the n-well and the p-well are physically connected directly to each other along a range of shared well depths; and
   computer executable instructions causing the computer to make a second layout for the circuit design, the second layout including a first non-floating p-well and a first non-floating n-well having a same fixed well bias.

2. The EDA tool of claim 1, wherein in the first layout of the circuit design, the n-well floats during operation of the p-type transistor.

3. The EDA tool of claim 1, wherein in the first layout of the circuit design, the p-well floats during operation of the n-type transistor.

4. The EDA tool of claim 1, wherein the first layout for the circuit design includes an electrical connection shared by the floating n-well and the floating p-well such that the floating n-well and the floating p-well float together.

5. The EDA tool of claim 1, wherein the first layout for the circuit design includes no electrical connection shared by the floating n-well and the floating p-well such that the floating n-well and the floating p-well float separately.

6. The EDA tool of claim 1, wherein in the first layout, the floating n-well has no well contacts.

7. The EDA tool of claim 1, wherein in the first layout, the floating p-well has no well contacts.

8. The EDA tool of claim 1, wherein in the second layout, the first non-floating n-well includes a first p-type transistor, and the first non-floating p-well includes a second n-type transistor.

9. The EDA tool of claim 1, wherein in the second layout, the same fixed well bias is intermediate between a source voltage and a drain voltage of at least one transistor in the first non-floating p-well.

10. The EDA tool of claim 1, wherein in the second layout, the same fixed well bias is intermediate between a source voltage and a drain voltage of at least one transistor in the first non-floating n-well.

11. The EDA tool of claim 1, wherein the first layout includes a forward bias applied to the floating p-well with respect to at least one of an n-type source and an n-type drain in the floating p-well.

12. The EDA tool of claim 1, wherein the second layout includes a forward bias applied to the first non-floating p-well with respect to at least one of an n-type source and an n-type drain in the first non-floating p-well.

13. The EDA tool of claim 1, wherein the first layout includes a forward bias applied to the floating n-well with respect to at least one of a p-type source and a p-type drain in the floating n-well.

14. The EDA tool of claim 1, wherein the second layout includes a forward bias applied to the first non-floating n-well with respect to at least one of a p-type source and a p-type drain in the first non-floating n-well.

15. An EDA (electronic design automation) tool, comprising:
   a non-transitory memory device having stored thereon:
      computer executable instructions causing a computer to make a first layout for a circuit design, the first layout including a floating n-well including a first p-type transistor and a floating p-well including a first n-type transistor, and the first layout including a first junction between differently doped regions, the first junction beneath the floating n-well, between the floating n-well and an underlying substrate region, wherein the n-well and the p-well are physically connected directly to each other along a range of shared well depths; and
      computer executable instructions causing the computer to make a second layout for the circuit design, the second layout including a first non-floating p-well and a first non-floating n-well having a same fixed well bias.

16. The EDA tool of claim 15, wherein in the second layout, the first non-floating n-well includes a second p-type transistor, and the first non-floating p-well includes a second n-type transistor.

17. The EDA tool of claim 15, wherein the first layout for the circuit design includes an electrical connection shared by the floating n-well and the floating p-well such that the floating n-well and the floating p-well float together.

18. The EDA tool of claim 15, wherein the first layout for the circuit design includes no electrical connection shared by the floating n-well and the floating p-well such that the floating n-well and the floating p-well float separately.

19. The EDA tool of claim 15, wherein in the first layout, the floating n-well has no well contacts.

20. The EDA tool of claim 15, wherein in the first layout, the floating p-well has no well contacts.

21. The EDA tool of claim 15, wherein in the second layout, the same fixed well bias is intermediate between a source voltage and a drain voltage of at least one transistor in the first non-floating p-well.

22. The EDA tool of claim 15, wherein in the second layout, the same fixed well bias is intermediate between a source voltage and a drain voltage of at least one transistor in the first non-floating n-well.

* * * * *